US008499267B2

(12) United States Patent
Awashima et al.

(10) Patent No.: US 8,499,267 B2
(45) Date of Patent: Jul. 30, 2013

(54) DELAY LIBRARY GENERATION APPARATUS AND METHOD BASED ON WIRING ARRANGEMENTS

(75) Inventors: Toru Awashima, Tokyo (JP); Yoshitaka Izawa, Kanagawa (JP)

(73) Assignee: Nec Corporation, Tokyo (JP)

( * ) Notice: Subject to any disclaimer, the term of this patent is extended or adjusted under 35 U.S.C. 154(b) by 33 days.

(21) Appl. No.: 13/254,335

(22) PCT Filed: Feb. 26, 2010

(86) PCT No.: PCT/JP2010/001310
§ 371 (c)(1),
(2), (4) Date: Sep. 1, 2011

(87) PCT Pub. No.: WO2010/100871
PCT Pub. Date: Sep. 10, 2010

(65) Prior Publication Data
US 2011/0320996 A1    Dec. 29, 2011

(30) Foreign Application Priority Data
Mar. 3, 2009  (JP) ................................. 2009-049115

(51) Int. Cl.
*G06F 17/50* (2006.01)
*G06F 9/455* (2006.01)
*G06G 7/62* (2006.01)

(52) U.S. Cl.
USPC .............. 716/113; 716/108; 716/134; 703/13

(58) Field of Classification Search
None
See application file for complete search history.

(56) References Cited

U.S. PATENT DOCUMENTS

| 6,018,624 | A | * | 1/2000 | Baxter | ............................. 703/16 |
| 8,024,685 | B2 | * | 9/2011 | Nitta et al. | ..................... 716/113 |
| 2008/0244487 | A1 | * | 10/2008 | Nitta et al. | ........................ 716/6 |
| 2011/0204918 | A1 | * | 8/2011 | Nojiri | ............................. 326/39 |

FOREIGN PATENT DOCUMENTS

| JP | 10-307860 A | 11/1998 |
| JP | 2000057182 A | 2/2000 |
| JP | 2002149727 A | 5/2002 |
| JP | 2002318828 A | 10/2002 |
| JP | 2004102739 A | 4/2004 |
| JP | 2006236214 A | 9/2006 |
| JP | 2008123458 A | 5/2008 |

OTHER PUBLICATIONS

International Search Report for PCT/JP2010/001310 mailed Apr. 27, 2010.
A. Marquardt et al., "Speed and Area Trade-offs in Cluster-Based FPGA Architectures", IEEE Transactions on Very Large Scale Integration (VLSI) Systems, vol. 8, No. 1, Feb. 2000.

* cited by examiner

*Primary Examiner* — A. M. Thompson

(57) ABSTRACT

A delay library generation apparatus, associated control method, and associated program are provided. The delay library generation apparatus comprises a storage device which stores architecture information of a logic element array, layout data of an overall programmable logic device, a netlist of the overall programmable logic device, and a wiring route extraction unit which refers to the storage device and extracts wiring route information regarding a wiring route section based on the architecture information. Moreover, the delay library generation apparatus comprises an analyzing unit which analyzes the layout data of the logic device and extracts parameters of a parasitic element and a crosstalk between adjacent interconnections. The delay generation apparatus further comprises a delay calculation unit which calculates delay data based on the extracted parameters and a delay library generation unit which generates a delay library of the logic device based on the wiring route information and the delay data.

15 Claims, 15 Drawing Sheets

☒ ON
☐ OFF

FIG. 7

| type | name | DELAY |
|---|---|---|
| ⋮ | ⋮ | ⋮ |
| Block | B71 | D71 |
| Wire | W72 | D72 |
| Sw | S73 | D73 |
| Wire | W74 | D74 |
| Sw | S75 | D75 |
| Wire | W76 | D76 |
| Sw | S77 | D77 |
| Wire | W78 | D78 |
| Block | B79 | D79 |
| ⋮ | ⋮ | ⋮ |

FIG. 11

| X | Y | type | name | DELAY |
|---|---|------|------|-------|
| ⋮ | ⋮ | ⋮ | ⋮ | ⋮ |
| 0 | 3 | Wire | W81 | D81 |
| ⋮ | ⋮ | ⋮ | ⋮ | ⋮ |
| 1 | 1 | Wire | W82 | D82 |
| ⋮ | ⋮ | ⋮ | ⋮ | ⋮ |

FIG. 15

| X | Y | type | name | DELAY |
|---|---|---|---|---|
| ⋮ | ⋮ | ⋮ | ⋮ | ⋮ |
| 0 | 0 | Clock | C71 | CD71 |
| 1 | 0 | Clock | C79 | CD79 |
| ⋮ | ⋮ | ⋮ | ⋮ | ⋮ |
| 0 | 0 | Block | B71 | D71 |
| 0 | 0 | Wire | W72 | D72 |
| 0 | 0 | Sw | S73 | D73 |
| 0 | 0 | Wire | W74 | D74 |
| 1 | 0 | Sw | S75 | D75 |
| 1 | 0 | Wire | W76 | D76 |
| 1 | 0 | Sw | S77 | D77 |
| 1 | 0 | Wire | W78 | D78 |
| 1 | 0 | Block | B79 | D79 |
| ⋮ | ⋮ | ⋮ | ⋮ | ⋮ |

DELAY LIBRARY GENERATION APPARATUS AND METHOD BASED ON WIRING ARRANGEMENTS

TECHNICAL FIELD

The present invention relates to a delay library generation system, in particular to a delay library generation system for a programmable logic device, a method of generating a delay library, a delay library generation apparatus, a method of controlling the same, a computer program, and a recording medium.

BACKGROUND ART

Non-Patent Document 1 describes an example of delay model of Field Programmable Gate Array (FPGA). In the delay model described in this document, delay of individual elements of logic element is given by a reference table which includes constant value independent of positions on the array. Delay on wiring routes herein is calculated based on a delay calculation model called Elmore delay model, and is characterized by a constant value independent of positions on the array.

Patent Document 1 (Japanese Laid-Open Patent Publication No. 2004-102739) and Patent Document 2 (Japanese Laid-Open Patent Publication No. 2008-123458) describe a delay analysis based on extraction of a parasitic device.

RELATED DOCUMENTS

Patent Documents

Patent Document 1: Japanese Laid-Open Patent Publication No. 2004-102739
Patent Document 2: Japanese Laid-Open Patent Publication No. 2008-123458

Non-Patent Document

Non-Patent Document 1: A. Marquardt, V. Betz, J. Rose, "Speed and Area Tradeoffs in Cluster-Based FPGA Architectures" in IEEE Transactions on VERY LARGE SCALE INTEGRATION (VLSI) SYSTEMS, February 2000, Vol. 8, No. 1, pp. 84-93

DISCLOSURE OF THE INVENTION

The above-described delay model has, however, been suffering from a low accuracy of calculation of wiring route delay. This is because physical properties of the wiring routes formed over Large Scale Integration (LSI) have not thoroughly been considered. As dimensional shrinkage of LSI has advanced in recent yeas, wiring route delay has accounted for increasing percentage of the overall circuit delay. As a result, the low level of accuracy in calculation of wiring route delay is a fatal problem.

An object of the present invention is to provide a delay library generation system, capable of solving the above-described problem regarding such low level of accuracy of calculation of wiring route delay.

According to the present invention, there is provided a delay library generation system including a generating unit which calculates delay information depending on states of arrangement of wiring according to arrangement of logic elements on an array, interconnections among the elements, and a global interconnection, thereby generating a delay library.

According to the present invention, there is provided a first delay library generation apparatus including a generating unit which calculates delay information depending on states of arrangement of wiring according to arrangement of logic elements on an array, interconnections among the elements, and a global interconnection, thereby generating a delay library.

According to the present invention, there is provided a second delay library generation apparatus which includes:

a storage device which stores architecture information regarding a logic element architecture on an array, layout data of an overall programmable logic device including information of a global interconnection, and a netlist of the overall programmable logic device;

a wiring route extraction unit which refers to the storage device, extracts wiring route information regarding wiring route section, based on the architecture information, and stores the wiring route information into the storage device;

an analyzing unit which analyzes the layout data of the overall programmable logic device, and extracts parameters of a parasitic element and a crosstalk caused between adjacent interconnections, the parasitic element and the crosstalk caused due to the global interconnection;

a delay calculating unit which calculates detailed delay based on the parameters extracted by the analyzing unit, and stores the calculated detailed delay as detailed delay data into the storage device; and a delay library generating unit which refers to the storage device, and generates a delay library of the programmable logic device, based on the wiring route information and the detailed delay data.

According to the present invention, there is provided a method of generating a delay library, including calculating delay information depending on states of arrangement of wiring according to arrangement of logic elements on an array, interconnections among the elements, and a global interconnection, thereby generating a delay library.

According to the present invention, there is provided a method of controlling a delay library generation apparatus, wherein the delay library generation apparatus includes a storage device which stores architecture information regarding a logic element architecture on an array, layout data of an overall programmable logic device including information of a global interconnection, and a netlist of the overall programmable logic device, and the method includes:

referring, by the delay library generation apparatus, to the storage device, to extract wiring route information regarding wiring route section, based on the architecture information, and then store the wiring route information into the storage device;

analyzing, by the delay library generation apparatus, the layout data of the overall programmable logic device, to extract parameters of a parasitic element and a crosstalk caused between adjacent interconnections, the parasitic element and the crosstalk caused due to the global interconnection;

calculating, by the delay library generation apparatus, detailed delay based on the extracted parameters, to store the calculated detailed delay as detailed delay data into the storage device; and referring, by the delay library generation apparatus, to the storage device, to generate a delay library of the programmable logic device, based on the wiring route information and the detailed delay data.

According to the present invention, there is provided a computer program embodying a delay library generation apparatus, wherein the delay library generation apparatus includes a storage device which stores architecture information regarding a logic element architecture on an array, layout data of an overall programmable logic device including information of a global interconnection, and a netlist of the overall programmable logic device, and the computer program is configured to make a computer perform:

a procedure for referring to the storage device, to extract wiring route information regarding wiring route section, based on the architecture information, and then store the wiring route information into the storage device;

a procedure for analyzing the layout data of the overall programmable logic device, to extract parameters of a parasitic element and a crosstalk caused between adjacent interconnections, the parasitic element and the crosstalk caused due to the global interconnection;

a procedure for calculating detailed delay based on the parameters extracted by the analyzing procedure, to store the calculated detailed delay as detailed delay data into the storage device; and a procedure for referring to the storage device, to generate a delay library of the programmable logic device, based on the wiring route information and the detailed delay data.

According to the present invention, there is provided a computer-readable recording medium having the computer program described in the above recorded therein.

Note that all arbitrary combinations of the above-described constituents, and all conversions of expression of the present invention, made among method, apparatus, system, recording medium and computer program, are valid as the exemplary embodiments of the present invention.

Note also that the various constituents of the present invention are not necessarily entities independent from each other, so that a plurality of constituents may configure a single component, a single component may be configured by a plurality of components, a certain constituent may be a part of other constituent, and a part of a certain constituent may be shared with a part of other constituent.

While the method and the computer program of the present invention are expressed by sequentially enumerating a plurality of procedures, the order of enumeration does not restrict the order of execution of such plurality of procedures. Accordingly, when the method and computer program of the present invention are embodied, the order of execution of the plurality of procedures may be modified, without adversely affecting the substance of the invention.

The plurality of procedures of the method and the computer program of the present invention are not always necessarily executed over different durations. Accordingly, one procedure may arise in the process of execution of other procedure, and, a part of, or the entire portion of, an execution timing of a certain procedure may overlap with an execution timing of other procedure.

EFFECT OF THE INVENTION

According to the present invention, a delay library generation system for a programmable logic device, capable of precisely calculating wiring route delay, may be provided.

BRIEF DESCRIPTION OF THE DRAWINGS

The above and other objects, features and advantages of the present invention will be more apparent from the following description of certain preferred exemplary embodiments taken in conjunction with the accompanying drawings listed below.

FIG. 7 is a view illustrating an exemplary wiring route delay table for each interconnection of a logic element.

FIG. 11 is a view illustrating an exemplary wiring route delay table based on (X, Y) coordinate of the logic element generated by a delay library generation unit of the delay library generation apparatus of the present invention.

FIG. 15 is a view illustrating an exemplary wiring route delay table based on (X, Y) coordinate of the logic element generated by a delay library generation unit of the delay library generation apparatus according to the exemplary embodiment the present invention.

DESCRIPTION OF THE EXEMPLARY EMBODIMENTS

Figure 1:
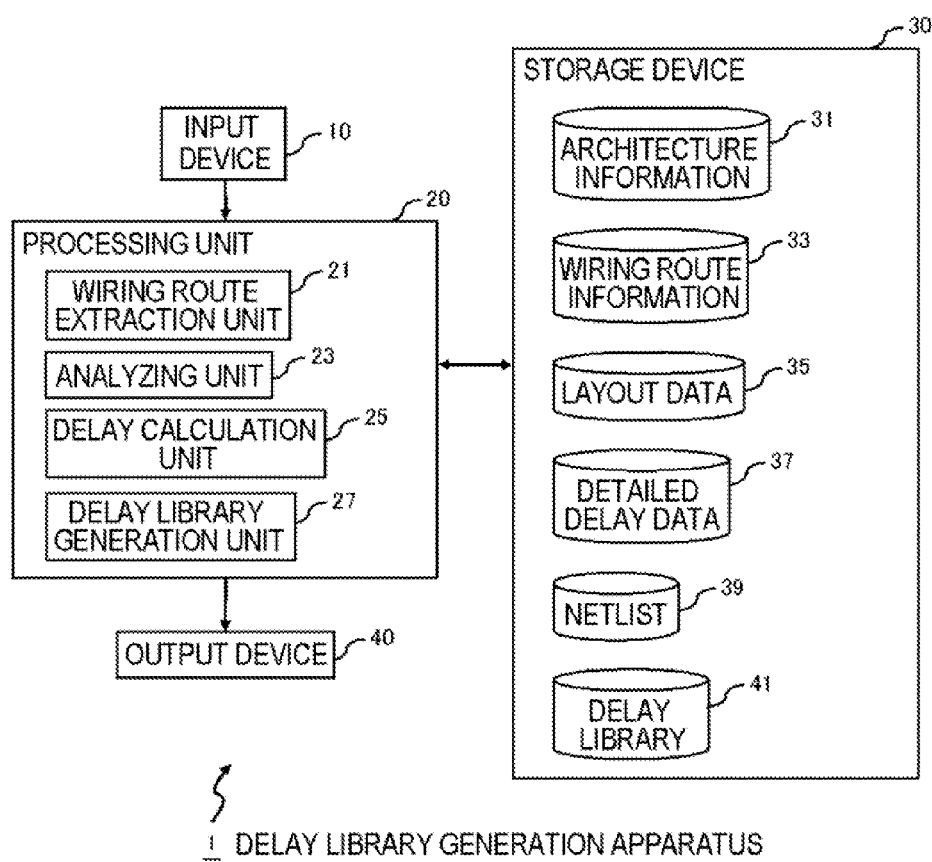
FIG. 1 is a block diagram illustrating a configuration of a delay library generation apparatus according to an exemplary embodiment of the present invention.

We will describe exemplary embodiments of the present invention below, referring to the attached drawings. Note that all similar constituents will be given similar reference numerals or symbols, and the description for them will not be repeated.

First Exemplary Embodiment

A delay library generation apparatus according to the exemplary embodiment of the present invention calculates delay on a wiring route formed on an LSI, in particular on a programmable logic device, and generates a delay library.

A delay library generation system of the present invention is adoptable to applications including a delay analyzing system which refers to a delay library, and an automatic design system including behavioral synthesis, logic synthesis, technology mapper, automatic placement or automatic wiring route, all of which similarly refer to the delay library.

Prior to explanation, a structure and a basic property of the Programmable Logic Device (PLD), represented by a Field Programmable Gate Array (FPGA), will be explained referring to a specific example.

Figure 3:
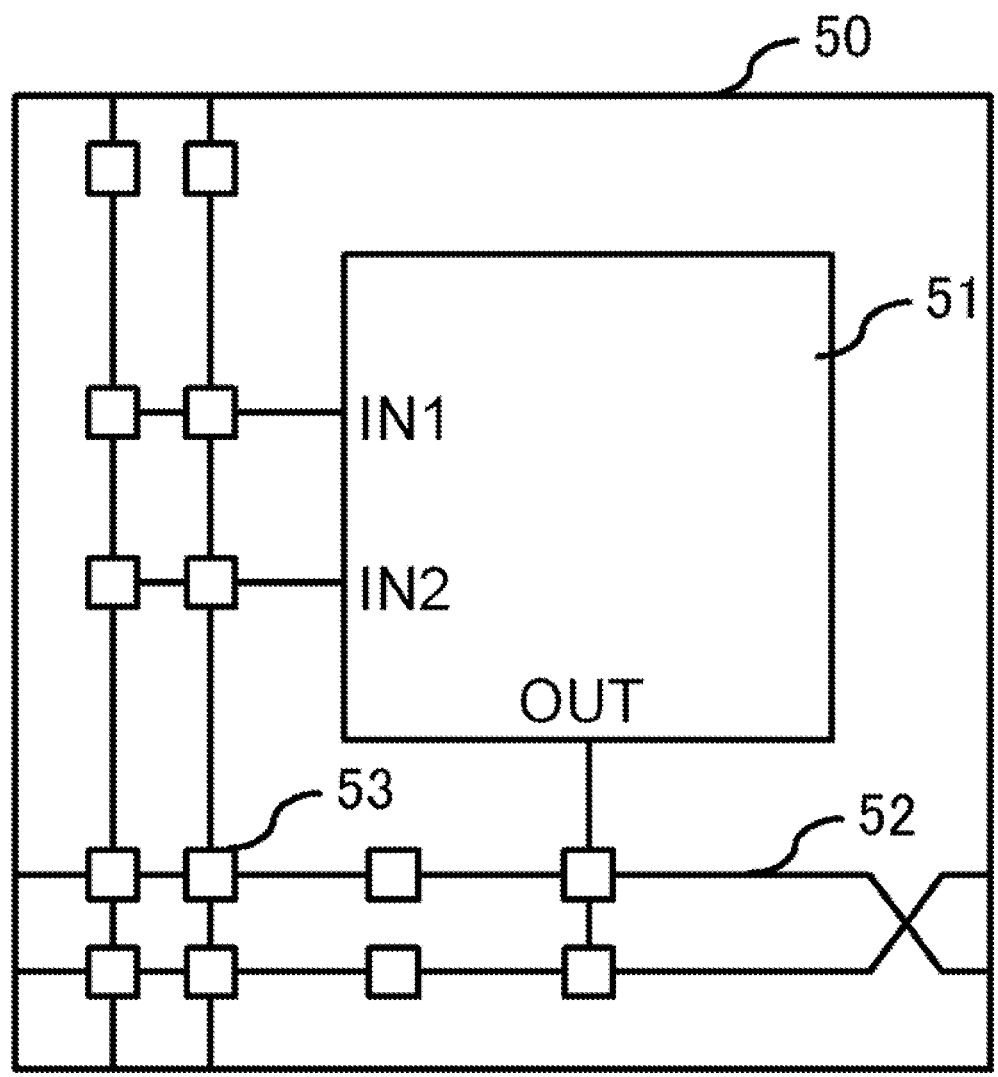
FIG. 3 is a view illustrating a specific example of a logic element dealt with by the present invention.

FIG. 3 is a view illustrating a specific example of a logic element dealt with by the present invention. In this drawing, a logic element 50, which is a basic element composing the programmable logic device, includes a programmable functional block 51. In this example, the programmable functional block 51 has two input terminals IN1, IN2 and one output terminal OUT. The programmable functional block 51 is connected using interconnects 52 with other logic element 50 (not illustrated in FIG. 3), via a plurality of programmable switches 53.

Figure 4:
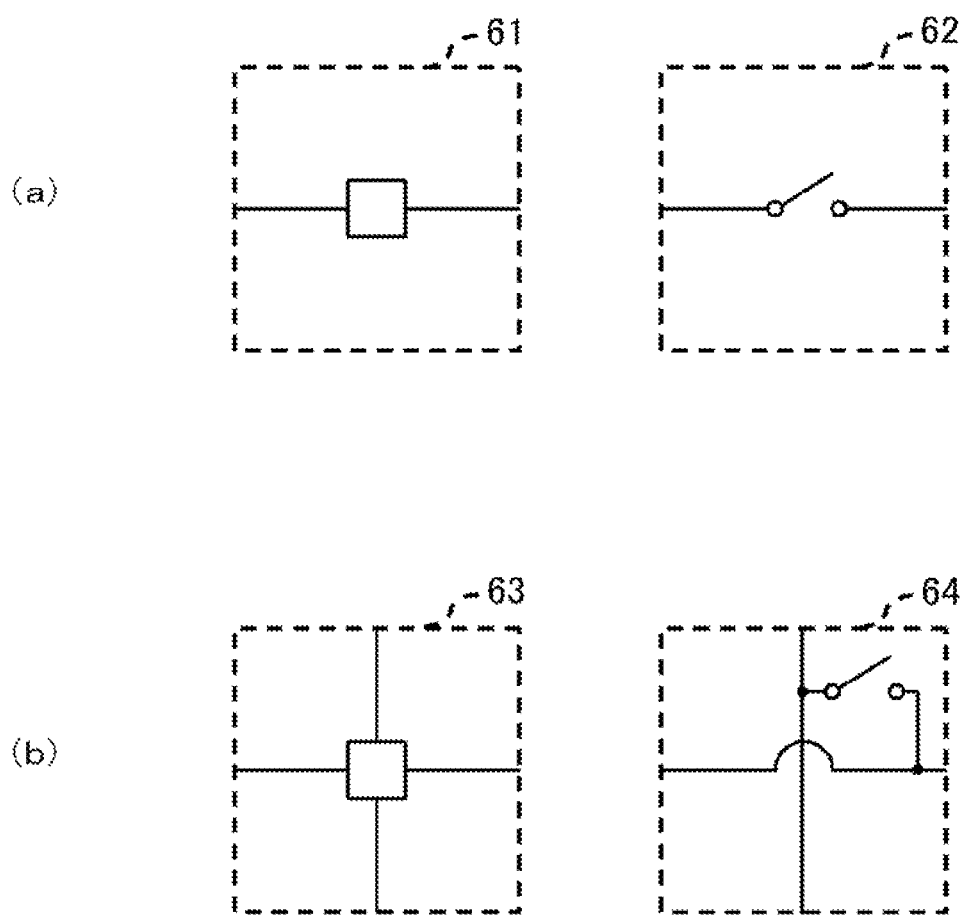
FIG. 4 is a view illustrating function of a programmable switch dealt with by the present invention.

FIG. 4 is a view illustrating function of the programmable switch in detail. In FIG. 4(a), a programmable switch indicated by reference numeral 61 is an interconnection switch which controllably switches ON or OFF in accordance with its configuration information, as indicated by reference numeral 62. In FIG. 4(b), a programmable switch indicated by reference numeral 63 is an interconnection switch which controllably switches ON or OFF in accordance with its configuration information, as indicated by reference numeral 64. While the programmable switch generally composes a configuration information memory and a pass transistor, the configuration of the programmable switch will not be explained in detail, because the present invention is independent of a method of configuring the programmable switch, and is irrelevant to nature of the present invention.

Figure 5:
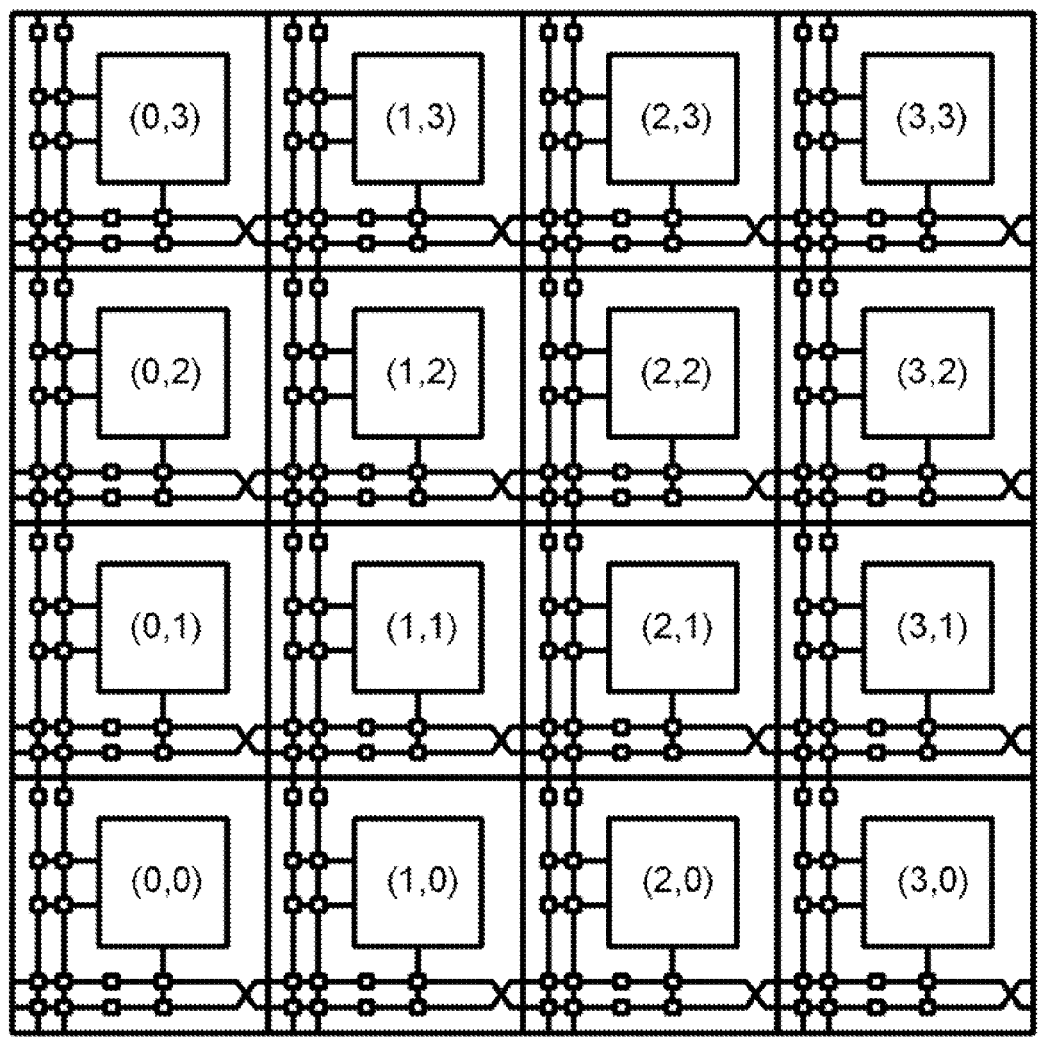
FIG. 5 is a planar arrangement view illustrating an exemplary logic element array dealt with by the present invention.

FIG. 5 is a view illustrating an exemplary logic element array on which the logic elements 50 one of which is illustrated in FIG. 3 are arranged so as to integrate into an array. A four-by-four logic element array is illustrated herein. As is clear from the above, the programmable logic device, represented by FPGA, thus generally composes an array structure configured with a logic element as required to form an array, the logic element being a basic element. Positions of the individual logic elements are indicated by coordinates on the array. FIG. 5 shows an exemplary array coordinate.

Figure 6:
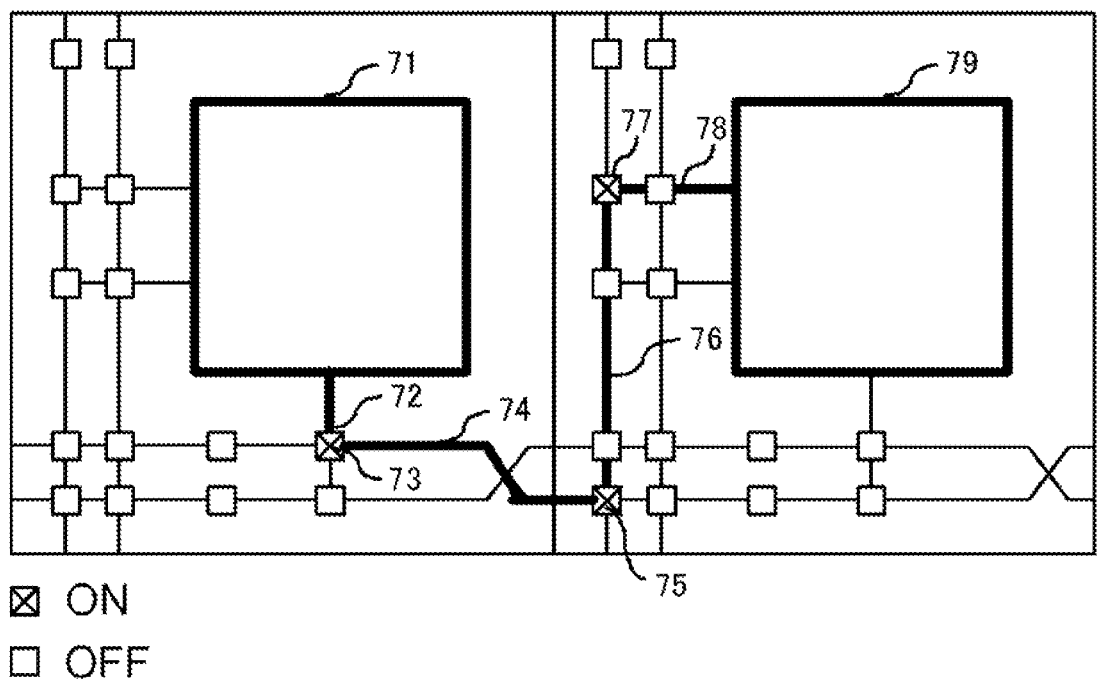
FIG. 6 is a view illustrating an exemplary wiring route from an output terminal of a functional block to an input terminal of another functional block.

FIG. 6 is a view illustrating an exemplary route formation between the functional blocks using the programmable switches. More specifically, the view exemplifies how the route is formed between the functional blocks using the programmable switches.

As illustrated in FIG. 6, a route from a functional block 71 at the start point to a functional block 79 at the end point traces, sequentially from the functional block 71 at the start point, an interconnection 72, a programmable switch 73, an interconnection 74, a programmable switch 75, an interconnection 76, a programmable switch 77, and an interconnection 78 to reach the functional block 79 at the end point. In this structure, signal propagation delay which occurs in propagating the signal from the functional block 71 at the start point to the functional block 79 at the end point is given by summing up delay ascribable to the individual constituents on the route including the functional blocks 71 and 79 at the start and end points, the programmable switches 73, 75, and 77, and the interconnections 72, 74, 76, and 78. In other words, three types of delay elements, ascribable to internal delay of the individual functional blocks, delay in the individual programmable switches, and delay in the individual wiring routes, are necessary for generating a delay library of the programmable logic device.

FIG. 7 is a view illustrating an exemplary delay table of the delay library generation apparatus according to the exemplary embodiment of the present invention. The delay table of this exemplary embodiment stores, for each of the constituents, the delay which is classified into three types depending on factors in casing the delay, and includes functional block (Block), programmable switch (Sw), and wiring route (Wire). Final delay in the illustrated example, may be given by a summation of D71 to D79 (D71+D72+D73+D74+D75+ D76+D77+D78+D79).

Figure 8:
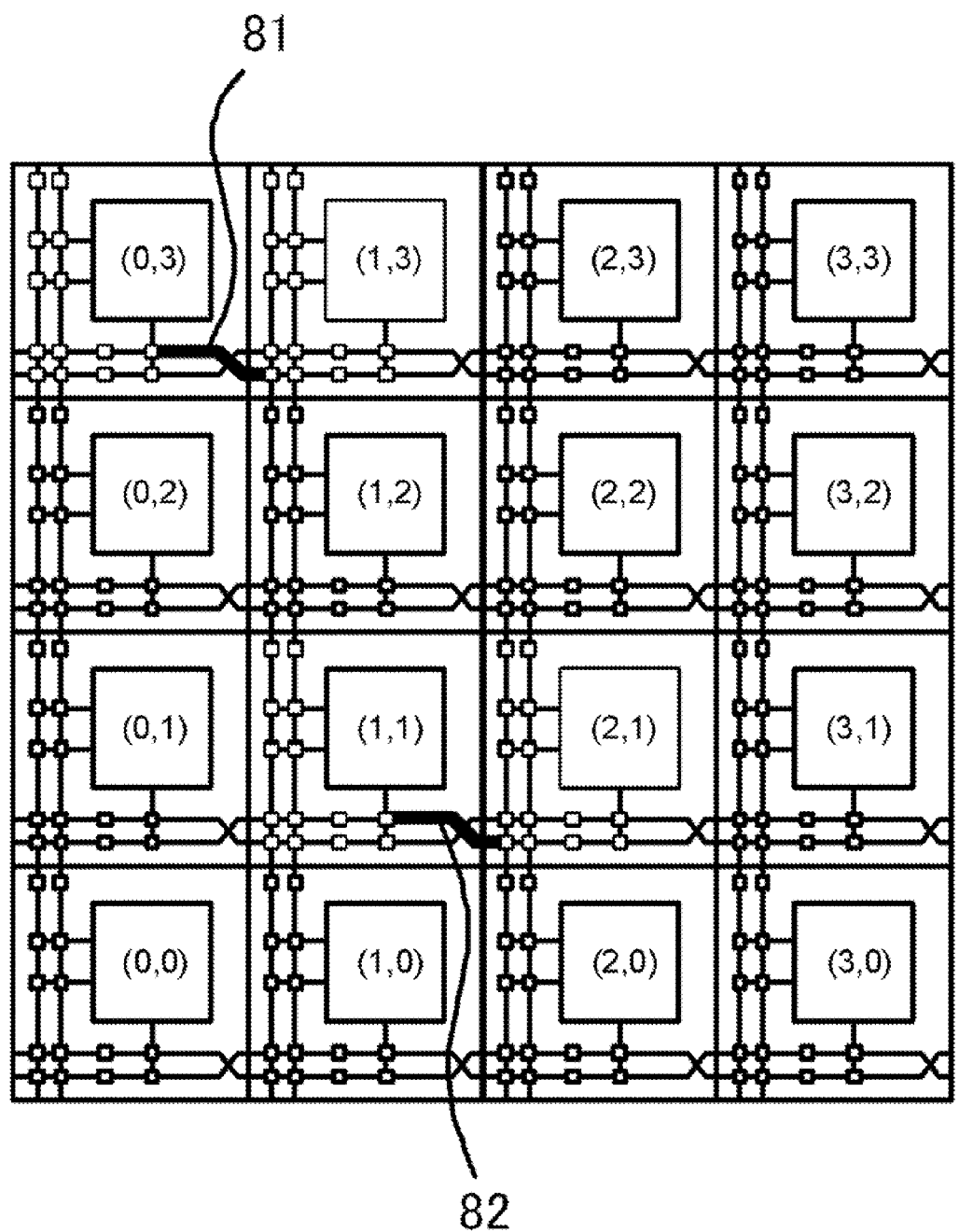
FIG. 8 is a view for explaining positions of interconnections at different coordinates on the logic element array.

In this exemplary embodiment, the programmable logic device includes a repeating structure configured with the logic elements 50 forming an array as illustrated in FIG. 5. Accordingly, there are many places in the array where the wiring route exists, each wiring route corresponding to the interconnection 74, for example, in FIG. 6. Referring now to FIG. 8, there are a wiring route 81 and a wiring route 82, for example, each corresponding to the wiring route.

It may be assumed that a delay distribution is uniform over the array when such an array structure is regarded as an ordered structure, and also when peripheral conditions of the respective interconnections are regarded as being all the same. When it is thus assumed that it is unnecessary to distinguish these elements, for example, the wiring route 81 and the wiring route 82 illustrated in FIG. 8, and these elements have the same delay, the delay table only generated for a single logic element 50 is sufficient for the delay information.

Figure 9:
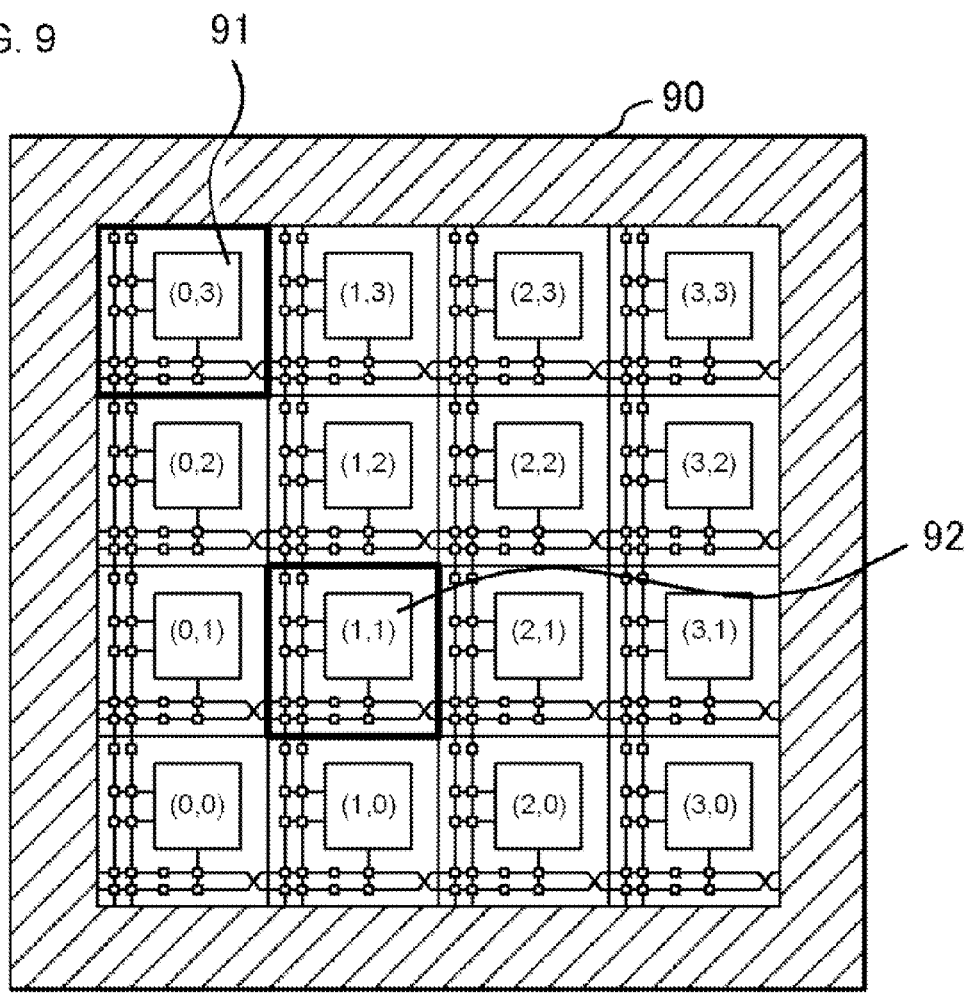
FIG. 9 is a planar arrangement view illustrating an exemplary case where the logic element array is surrounded by an additional circuit placed in adjacent thereto.

An actual programmable logic device, however, has a non-uniform delay distribution over an array, because a physical condition is uniform neither around the array nor over the array. A first specific reason is that the array has an additional circuit, such as an input/output circuit, which is different from the logic element, the additional circuit being, for example, a circuit 90 illustrated in FIG. 9 and placed around outer periphery of the array, and thus there is a difference in the state of arrangement of wiring within the array. As a result, when the delay is calculated in detailed by taking account of capacitance of a parasitic element and crosstalk, the different results are obtained in the calculated delay between the logic element on the periphery represented by a logic element 91 in FIG. 9, and the logic element placed deep inside the array represented by a logic element 92 in FIG. 9. It is widely known that delay largely varies particularly on an interconnection as dimensional shrinkage has advanced in recent year. A second specific reason is due to effects of a global interconnection which extends over the array, represented by a global interconnection 100 illustrated in FIG. 10.

Figure 10:
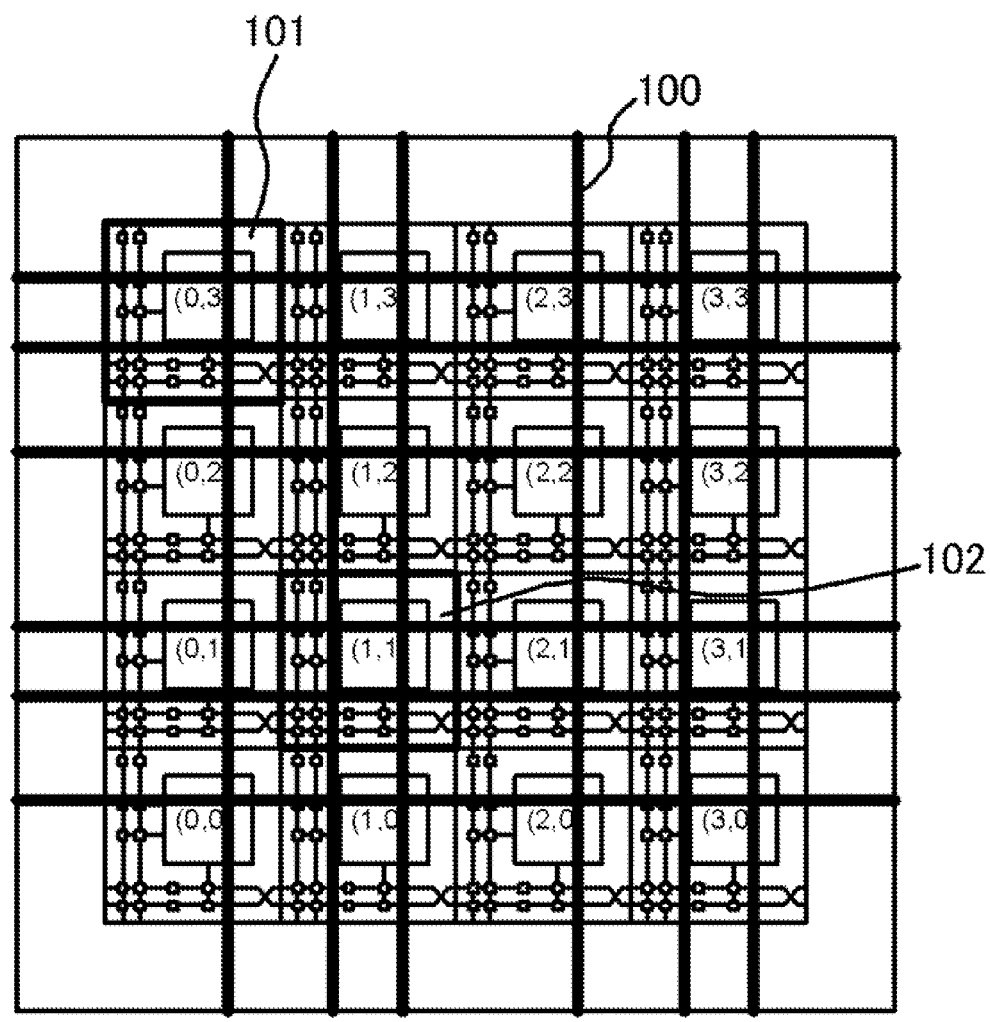
FIG. 10 is a planar arrangement view illustrating an exemplary case where global interconnections are laid over the logic element array.

The global interconnection 100 herein configures an interconnection structure which includes clock, source power, and control lines covering a chip overall, but are not contained in the logic element. Since the global interconnection 100 is independent of the regularity of the logic element array, the global interconnection 100 influences respective logic elements on the array to become non-uniform in physical condition. As a results, when the delay is calculated in detailed by taking account of capacitance of a parasitic element and crosstalk, the different results are obtained in the calculated delay between a logic element 101 (FIG. 10) and a logic element 102 (FIG. 10).

It is now understood from the discussion in the above that it is necessary for an actual programmable logic device to deal with delay information of the wiring route by taking account of variation in the state of arrangement of wiring in the periphery of the array and over the array. FIG. 11 is an exemplary delay table based on a (X, Y) coordinate of the logic element, which can separately store delay values of, for example, the wiring route 81 and the wiring route 82 illustrated in FIG. 8. Note that, in an example illustrated in FIG. 11, the coordinate where the start point of each wiring route belongs to represents the coordinate where the wiring route belongs to.

The first exemplary embodiment of the present invention will be described in detailed below, referring to the attached drawings.

FIG. 1 is a block diagram illustrating a configuration of the delay library generation apparatus according to the exemplary embodiment of the present invention.

The delay library generation apparatus 1 of this exemplary embodiment relates to a delay library generation system of a programmable logic device.

The delay library generation system of the exemplary embodiment of the present invention includes the generation apparatus 1 which calculates delay information depending on states of arrangement of wiring according to arrangement of logic elements on an array, interconnections among the elements, and a global interconnection, to thereby generate a delay library.

The delay library generation apparatus 1 of this exemplary embodiment includes a storage device 30 which stores architecture information 31 regarding a logic element architecture on an array, layout data 35 of an overall programmable logic device including information of a global interconnection, and a netlist 39 of the overall programmable logic device; a wiring route extraction unit 21 which refers to the storage device 30, and based on the architecture information 31, extracts wiring route information 33 regarding wiring route section and store the wiring route information 33 into the storage device 30; an analyzing unit 23 which analyzes layout data 35 of the overall programmable logic device, and extracts parameters of a parasitic element and a crosstalk caused between adjacent interconnections, the parasitic element and the crosstalk caused due to the global interconnection; a delay calculation unit 25 which calculates detailed delay based on the parameters extracted by the analyzing unit 23, and stores the calculated detailed delay as detailed delay data 37 into the storage device 30; and a delay library generation unit 27 which refers to the storage device 30, and based on the wiring route information 33 and the detailed delay data 37, generates a delay library 41 of the programmable logic device.

More specifically, the delay library generation apparatus 1 of this exemplary embodiment has an input device 10, a processing unit 20, the storage device 30, and an output device 40.

The delay library generation apparatus 1 may be embodied by a personal computer or workstation, equipped with a Central Processing Unit (CPU), a memory, a hard disk and a communication device, or equivalent devices, not shown in the drawings. In the individual drawings, configurations irrelevant to nature of the present invention are not illustrated.

Each constituent of the delay library generation apparatus 1 may be embodied by an arbitrary computer in an arbitrary combination of hardware and software, the computer mainly including a CPU, a memory, a program loaded on the memory so as to embody the constitutional elements illustrated in the drawing, a storage unit such as hard disk which stores the program, and an interface for network connection. Those skilled in the art may understand various modifications derived from methods of exemplary embodiment and relevant devices. The drawings explained below illustrate function-based blocks, rather than hardware-based configuration.

The input device 10 includes operation input devices such as keyboard, mouse, tablet and touch panel; a receiver which receives data via a network (not illustrated) from other devices; or a recording media reader which reads data from various recording media and inputs the obtained data; and an image reader such as scanner.

The output device 40 includes display devices such as CRT monitor and liquid crystal display device, a printer capable of printing text or image, and a recording media writing device for writing data into various recording media.

The processing unit 20 typically corresponds to the body of the delay library generation apparatus 1, and embodies the delay library generation apparatus 1 typically by running a computer program for controlling the delay library generation apparatus 1.

The storage device 30 is connected to the processing unit 20, and typically has an auxiliary storage device such as hard disk, which stores a computer program to be executed by the CPU (not shown in the drawings) of the processing unit 20 and various information described later; and a main storage device which provides a work area when the processing unit 20 runs the computer program. The storage device 30 typically stores architecture information 31 of the logic element array, wiring route information 33, layout data 35 of the overall programmable logic device, detailed delay data 37, the netlist 39 of the overall programmable logic device, and the delay library 41.

The architecture information 31 of the logic element array includes information regarding structure of a plurality of logic elements on an array, the structure including interconnections between the respective logic elements on the array. The architecture information 31, for example, includes information regarding the interconnections of the respective logic elements on the array, and information regarding the global interconnection of the array.

The wiring route information 33 includes information regarding the wiring route section, necessary for delay analysis of the programmable logic device. The layout data 35 is layout data of the overall programmable logic device, and includes information regarding the global interconnection. The detailed delay data 37 will be described later.

The netlist 39 includes a netlist of the overall programmable logic device. The delay library 41 includes the delay library generated by the delay library generation apparatus 1 of this exemplary embodiment. The delay library 41 is generated only once for a single species of the programmable logic device. The delay library 41 is available for delay analysis of the programmable logic device or for an automatic design tool.

Design of the programmable logic device has two stages of the design process. A first step of design relates to design of hardware of the programmable logic device per se. In other words, the first step relates to a design stage of LSI having programmable functions, and optimizes various factors including how the logic element should be configured, how many interconnections should lie, how the switch should be placed, and so forth.

A second step of design relates to design of constitutional information (software) of the programmable logic device. In other words, the constitutional information is designed so as to enable desired functions on the hardware obtained in the first step. The constitutional information herein means bit information which defines calculation function of the logic element and activation of the interconnection (ON/OFF of the switches). The delay library generation apparatus 1 of this exemplary embodiment, being given the device completing the first step of design, generates the delay library which is referred in the second step of design.

For example, a CAD system for designing the programmable logic device generates constitutional information for embodying application logic. The CAD system includes the delay library addressable to the various species, the delay library being generated by the delay library generation apparatus 1 of this exemplary embodiment. The designer refers to the delay library when he or she selects the species, and analyzes delay of the designed constitutional information (logic circuit built therein). Alternatively, the automatic CAD per se, which generates the constitutional information, refers to the delay library in the process of generation.

The processing unit 20 has the wiring route extraction unit 21, the analyzing unit 23, the delay calculation unit 25, and the delay library generation unit 27.

The wiring route extraction unit 21 refers to the architecture information 31 of the logic element array, extracts all wiring route sections necessary for delay analysis of the programmable logic device, and outputs the results to the storage device 30 so as to store the results as the wiring route information 33.

The analyzing unit 23 takes part in RC extraction and crosstalk analysis. The analyzing unit 23 analyzes the layout data 35 of the overall programmable logic device, and extracts parameters of a parasitic element and a crosstalk caused between adjacent interconnections due to the global interconnection, the parasitic device and the crosstalk being not expressed in the logic elements. The delay calculation unit 25 calculates the detailed delay based on the results of analysis by the analyzing unit 23, and outputs the detailed delay as the detailed delay data 37.

The delay library generation unit 27 reads the wiring route information 33 and the detailed delay data 37 so as to generate the delay library 41 necessary for delay analysis of the programmable logic device. The thus-generated delay library 41 includes, as a delay element, internal delay information of the functional block, delay information of the programmable switch, and detailed delay information of all route sections specified by the wiring route information 33.

In this exemplary embodiment, the delay library 41 has a delay table (wiring route delay table) as illustrated in FIG. 11, in which the delay information is associated with respective arrangement coordinate (X, Y) on the array.

The delay library generation apparatus 1 embodies the functions of the respective units, while making the CPU read into the memory and execute the program stored in the hard disk, as described in the above.

The computer program of this exemplary embodiment is a computer program for embodying the delay library generation apparatus 1, and is described to make a computer perform: a procedure for referring to the storage device 30, to extract wiring route information 33 regarding wiring route section, based on the architecture information 31, and then store the wiring route information 33 into the storage device 30; a procedure for analyzing the layout data 35 of the overall programmable logic device, so as to extract parameters of a parasitic element and a crosstalk caused between adjacent interconnections, the parasitic element and the crosstalk caused due to the global interconnection; a procedure for calculating the detailed delay based on the parameters extracted by the above analyzing procedure, and to store the calculated detailed delay as detailed delay data 37 into the storage device 30; and a procedure for referring to the storage device 30, to generate a delay library of the programmable logic device, based on the wiring route information 33 and the detailed delay data 37.

Figure 2:
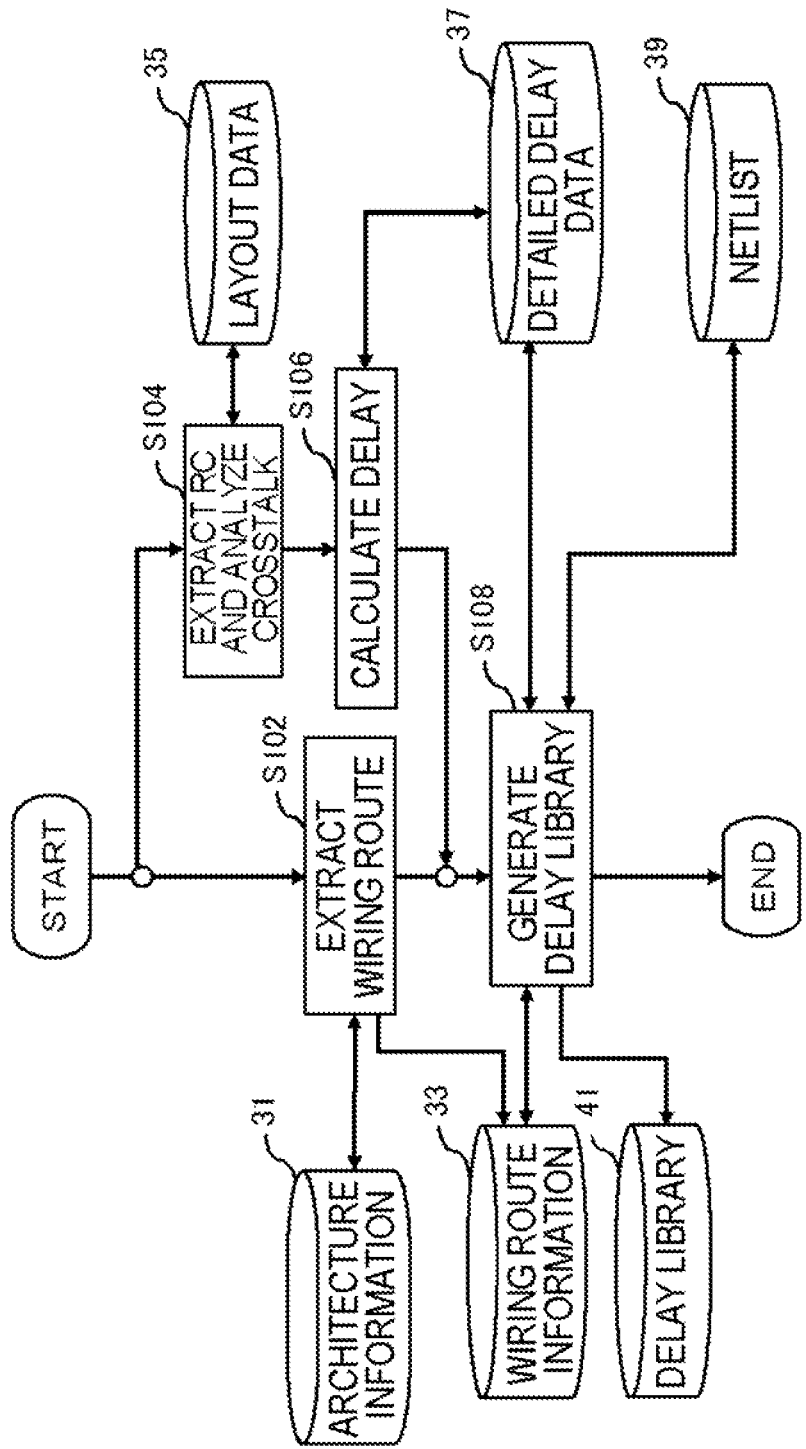
FIG. 2 is a flow chart illustrating an exemplary operation of the delay library generation apparatus according to the exemplary embodiment of the present invention.

Operations of the thus-configured delay library generation apparatus 1 of this exemplary embodiment will be explained below. FIG. 2 is a flow chart illustrating exemplary operations of the delay library generation apparatus according to the exemplary embodiment of the present invention. The operation will be explained below, referring to FIGS. 1 and 2.

The method of controlling the delay library generation apparatus 1 of this exemplary embodiment includes: referring, by the delay library generation apparatus 1, to the storage device 30, so as to extract the wiring route information 33 regarding the wiring route section, based on the architecture information 31, and to then store the route information 33 into the storage device 30 (step S102); analyzing, by the delay library generation apparatus 1, the layout data 35 of the overall programmable logic device so as to extract parameters of a parasitic element and a crosstalk caused between adjacent interconnections, the parasitic element and the crosstalk caused due to said global interconnection (step S104); calculating, by the delay library generation apparatus 1, detailed delay based on the extracted parameters, and to store the detailed delay as detailed delay data 37 into the storage device 30 (step S106); and referring, by the delay library generation apparatus 1, to the storage device 30, so as to generate the delay library 41 of the programmable logic device, based on the wiring route information 33 and the detailed delay data 37 (step S108).

For more details, first, the wiring route extraction unit 21 refers to the architecture information 31 of the logic element array, extracts all wiring route sections necessary for delay analysis of the programmable logic device, and outputs the results to the wiring route information 33 (step S102).

The analyzing unit 23 then analyzes the layout data 35 of the overall programmable logic device and extracts parameters of parasitic device and crosstalk caused between the adjacent interconnections (step S104). The delay calculation unit 25 calculates the detailed delay based on the results of analysis by the analyzing unit 23, and outputs the results as the detailed delay data 37 (step S106).

The delay library generation unit 27 then reads the wiring route information 33 obtained in step S102 and the detailed delay data 37 obtained in step S106, and generates the delay library 41 necessary for delay analysis of the programmable logic device (step S108).

An exemplary advantage according to the invention is that the delay library generation apparatus 1 of the exemplary embodiment can generates the delay library based on wiring route delay with highly accuracy by taking account of physical characteristics of the wiring routes formed on the LSI as explained in the above.

In this exemplary embodiment, the conductor delay library necessary for delay analysis of the programmable logic device includes the detailed delay information of all routes specified by the wiring route information 33. In addition, the analysis of the layout data 35 of the overall programmable logic device makes it possible to take account of parasitic capacitance and crosstalk caused due to the global interconnection, neither of which is expressed in the logic elements. By referring to the delay library 41, it is possible to execute, based on delay information with the highly-accurate, the delay analysis of the programmable logic device and the automatic design tool. As a result, constitutional information of further highly optimized circuit can be obtained.

Second Exemplary Embodiment

Figure 12:
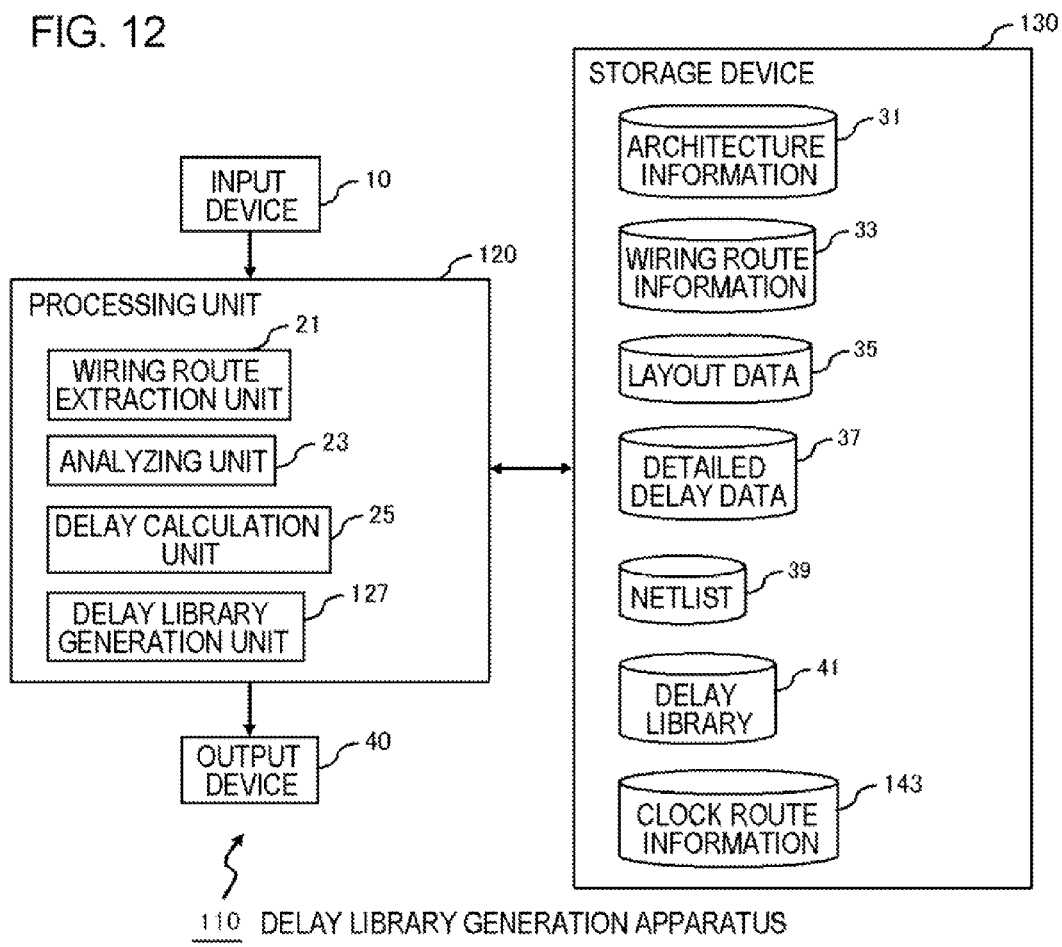
FIG. 12 is a block diagram illustrating a configuration of the delay library generation apparatus of an exemplary embodiment of the present invention.

FIG. 12 is a block diagram illustrating a configuration of the delay library generation apparatus according to exemplary embodiment of the present invention. The delay library generation apparatus 110 of this exemplary embodiment is different from the delay library generation apparatus 1 of the above-described exemplary embodiment illustrated in FIG. 1, in that the delay library generation apparatus 110 takes into account difference in clock delay (also referred to as "clock skew") with respect to the functional block on the logic element.

Influence of the clock skew has become unignorable under increased variation in recent trends in higher processing speed and dimensional shrinkage. Nevertheless, the delay may be overestimated if the worst clock skew only were reflected. This exemplary embodiment, in contrast, reflects the clock skew to the delay library in a route-by-route manner, thereby achieving an effect similar to that in the above-described exemplary embodiment and additional effect caused by depending on the influence of the clock skew.

In the delay library generation apparatus 110 of this exemplary embodiment, the logic element includes the functional block, the storage device 130 further stores, for each route towards the functional block on the logic element, clock route information 143 which indicates clock delay, and the delay library generating unit 127 refers to the storage device 130, and generates the delay library 41, based on the clock route information 143 as well as the wiring route information 33 and the detailed delay data 37, depending on a difference in clock delay with respect to the functional block.

For more details, the delay library generation apparatus 110 of this exemplary embodiment includes: a delay library generation unit 127 in the processing unit 120 which performs depending on the clock skew, in place of the delay library generation unit 27 of the processing unit 20 owned by the delay library generation apparatus 1 illustrated in FIG. 1; and the storage device 130 which further stores the clock route information 143 besides all of the information stored in the storage device 30, in place of the storage device 30 of the delay library generation apparatus 1 illustrated in FIG. 1.

The clock route information 143 includes, for example, a clock route towards the functional block.

The delay library generation apparatus 110 makes a CPU read, into a memory, a program which has been stored in a hard disk and execute the read program as described above, thereby making it possible to embody the functions of the respective units.

The computer program of this exemplary embodiment is a computer program for embodying the delay library generation apparatus 110, and is described to make a computer perform a procedure for referring to the storage device 130, to generate the delay library, based on the clock route information 143 as well as the wiring route information 33 and the detailed delay data 37 depending on a difference in clock delay with respect to the functional block on the logic element. Moreover, the recording medium of this exemplary embodiment is a computer-readable recording medium which records the computer program of this exemplary embodiment.

Figure 13:
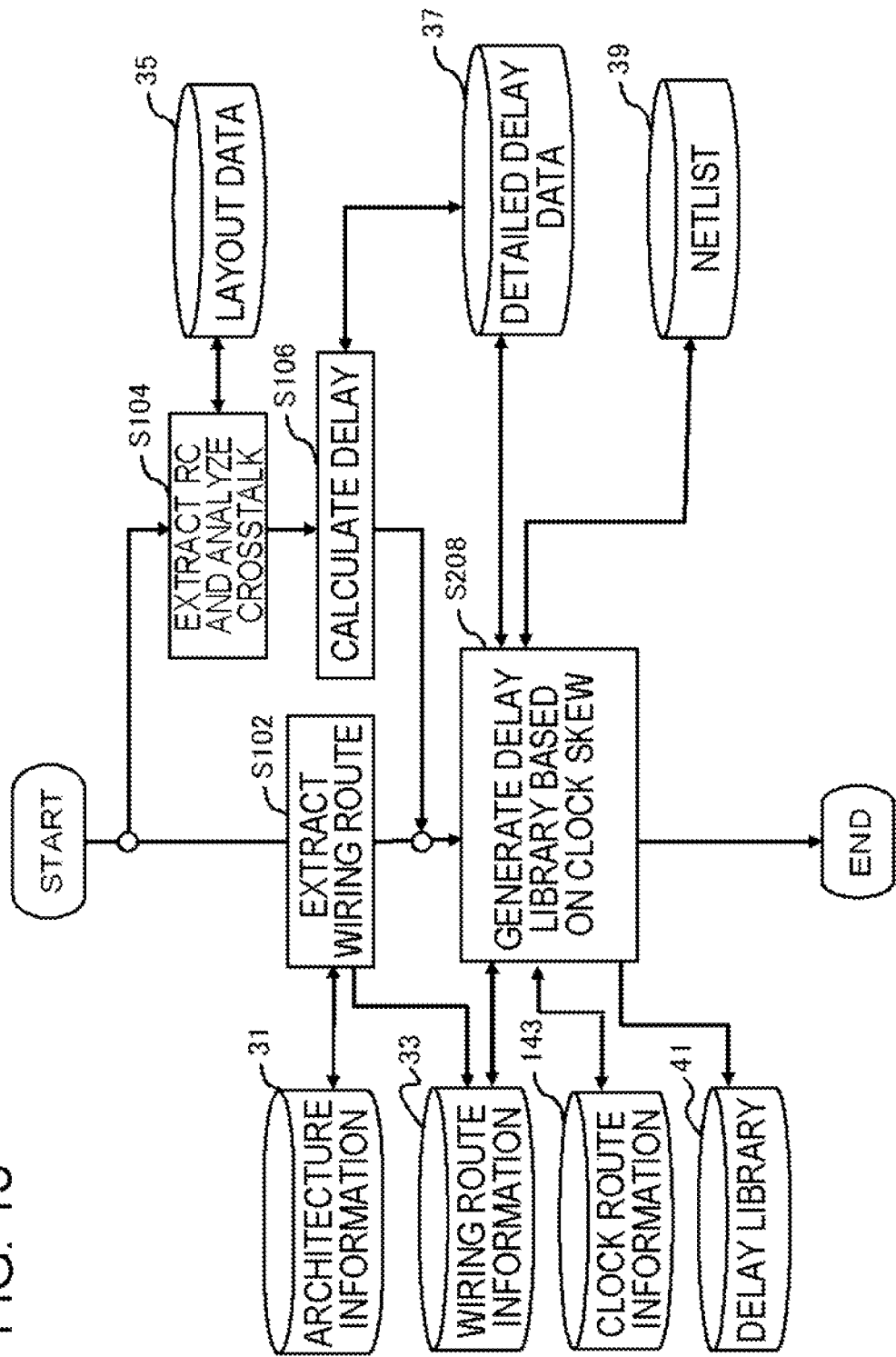
FIG. 13 is a flow chart illustrating an exemplary operation of the delay library generation apparatus according to the exemplary embodiment of the present invention.

Operations of the thus-configured delay library generation apparatus 110 of this exemplary embodiment will be explained below. FIG. 13 is a flow chart illustrating exemplary operations of the delay library generation apparatus according to the exemplary embodiment of the present invention.

In the method of controlling the delay library generation apparatus 110 of this exemplary embodiment, and in the process of generation of the delay library 41, the delay library generation apparatus 110 refers to the storage device 130, and generates the delay library 41 of the programmable logic device, based on the clock route information 143 as well as the wiring route information 33 and the detailed delay data 37, depending on a difference in the clock delay with respect to the functional block on the logic element (step S208).

For more details, the flow chart shown in FIG. 13 includes step S208 for generating the delay library depending on the clock skew, in place of the step S108 in the flow chart shown in FIG. 2. In the step S208, the delay library generation unit 127 not only reads the wiring route information 33 obtained in step S102 and the detailed delay data 37 obtained in step S106 so as to extract the delay on route on the logic elements, but also reads the clock route information 143 in the storage device 130 so as to extract delay on the clock route.

Figure 14:
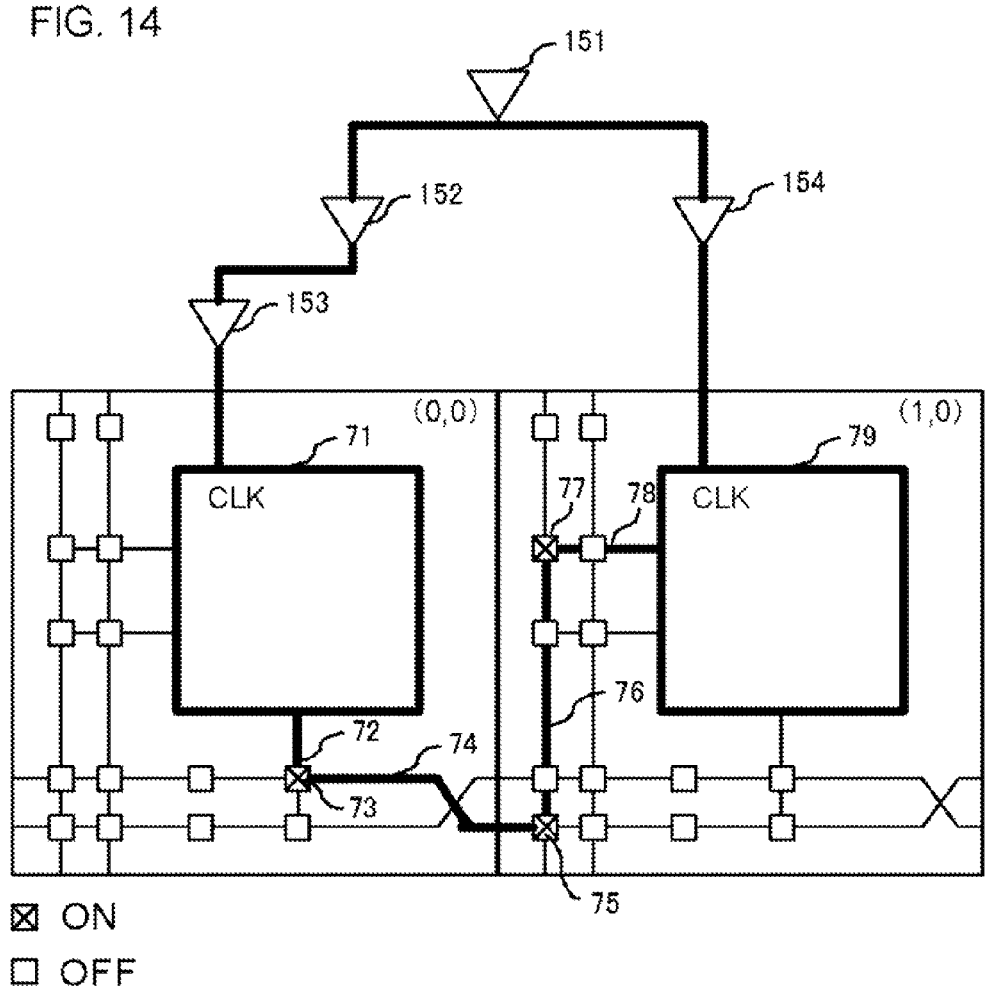
FIG. 14 is a view illustrating an exemplary section on a wiring route depending on a clock route.

FIG. 14 illustrates an exemplary case additionally taking the clock route into the route between the functional blocks illustrated in FIG. 6. The clock route contains a route which runs from a root buffer 151 of clock via a buffer 152 and a buffer 153 to reach a clock port CLK of the functional block 71, and a route which runs from the root buffer 151 of clock via a buffer 154 to reach the clock port CLK of the functional block 79. FIG. 15 illustrates an exemplary delay library taking account of the route of clock. The delay library stores therein delay ascribable to the individual constitutional elements on the route between the functional blocks on the logic element illustrated in FIG. 14, and delay ascribable to the clock route. The delay may be calculated so as to depend on the clock skew caused on the route between the functional blocks, by adding the route delay (D71+D72+D73+D74+D75+D76+D77+D78+D79) to route delay (CD71) caused in a route from the root buffer 151 of clock to the clock port CLK of the functional block 71, and subtracting route delay (CD79) caused in a route from the root buffer 151 of clock to the clock port CLK of the functional block 79. Here, the route delay among the functional blocks (D71+D72+D73+D74+D75+D76+D77+D78+D79) may be obtained by summing up delay values of the respective constituents. As a result, the delay (D71+D72+D73+D74+D75+D76+D77+D78+D79+CD71−CD79) may be obtained. CD71−CD79 herein corresponds to the clock skew.

As explained in the above, an exemplary advantage according to the invention is the delay library generation apparatus 110 of this exemplary embodiment has an effect of the above-described exemplary embodiment as well as an effect that the delay library can be generated by taking account of influences of the clock skew.

The exemplary embodiments of the present invention have been described referring to the attached drawings, merely for exemplary purposes, while allowing adoption of various configurations other than those described in the above.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2009-099115 filed on Mar. 3, 2009, the disclosure of which is incorporated herein in its entirety by reference.

The invention claimed is:

1. A delay library generation apparatus comprising a generating unit which calculates delay information and generates a delay library based on the calculated delay information,
wherein said delay information is calculated depending on states of arrangement of wiring, and said states of arrangement of wiring are dictated according to an arrangement of logic elements on an array, interconnections among the elements, and a global interconnection.

2. A delay library generation apparatus comprising:
a storage device which stores architecture information regarding a logic element architecture on an array, layout data of an overall programmable logic device including information of a global interconnection, and a netlist of the overall programmable logic device;
a wiring route extraction unit which refers to said storage device, extracts wiring route information regarding wiring route section, based on said architecture information, and stores said wiring route information into said storage device;
an analyzing unit which analyzes said layout data of said overall programmable logic device, and extracts parameters of a parasitic element and a crosstalk caused between adjacent interconnections, said parasitic element and said crosstalk caused due to said global interconnection;
a delay calculating unit which calculates detailed delay based on said parameters extracted by said analyzing unit, and stores the calculated detailed delay as detailed delay data into said storage device; and
a delay library generating unit which refers to said storage device, and generates a delay library of said programmable logic device, based on said wiring route information and said detailed delay data.

3. The delay library generation apparatus according to claim 2,
wherein said delay library includes a delay table having delay information associated with a respective coordinate of an arrangement of said logic element on said array.

4. The delay library generation apparatus according to claim 3,
wherein said logic element includes a functional block,
said storage device further stores, for each route towards said functional block on said logic element, clock route information which indicates clock delay, and
said delay library generating unit refers to said storage device, and generates said delay library, based on said clock route information as well as said wiring route information and said detailed delay data depending on a difference in said clock delay with respect to said functional block on said logic element.

5. The delay library generation apparatus according to claim 4,
wherein said logic element further includes a programmable switch, and
said delay library includes: internal delay information of said functional block; delay information of said programmable switch; and delay information of all route sections specified by said wiring route information.

6. The delay library generation apparatus according to claim 2,
wherein said delay library is referenced by a computer aided design (CAD) system.

7. A method of generating a delay library, comprising calculating, by a delay library generation apparatus, delay information and generating, by a delay library generation apparatus, a delay library based on the calculated delay information,
said delay information being calculated depending on states of arrangement of wiring, said states of arrangement of wiring being dictated according to an arrangement of logic elements on an array, interconnections among the elements, and a global interconnection.

8. A method of controlling a delay library generation apparatus, wherein
said delay library generation apparatus comprises a storage device which stores architecture information regarding a logic element architecture on an array, layout data of an overall programmable logic device including information of a global interconnection, and a netlist of the overall programmable logic device, and
said method comprises:
referencing, by said delay library generation apparatus, said storage device, to extract wiring route information regarding wiring route section, based on said architecture information, and then store said wiring route information into said storage device;
analyzing, by said delay library generation apparatus, said layout data of said overall programmable logic device, to extract parameters of a parasitic element and a crosstalk caused between adjacent interconnections, said parasitic element and said crosstalk caused due to said global interconnection;
calculating, by said delay library generation apparatus, detailed delay based on the extracted parameters, to store the calculated detailed delay as detailed delay data into said storage device; and
referencing, by said delay library generation apparatus, said storage device, to generate a delay library of said programmable logic device, based on said wiring route information and said detailed delay data.

9. The method of controlling a delay library generation apparatus according to claim 8,
wherein said delay library includes a delay table having delay information associated with respective coordinate of arrangement of said logic element on said array.

10. The method of controlling a delay library generation apparatus according to claim 9,
wherein said logic element includes a functional block,
said storage device of said delay library generation apparatus further stores, for each route towards said functional block on said logic element, clock route information which indicates clock delay, and
in the process of generating said delay library, said delay library generation apparatus refers to said storage device, and generates said delay library, based on said clock route information as well as said wiring route information and said detailed delay data depending on a difference in said clock delay with respect to said functional block on said logic element.

11. The method of controlling a delay library generation apparatus according to claim 10,
wherein said logic element further includes a programmable switch, and
said delay library includes: internal delay information of said functional block;
delay information of said programmable switch; and delay information of all route sections specified by said wiring route information.

12. A non-transitory computer-readable recording medium having recorded thereon a computer program which when executed by a processor comprised in a delay library generation apparatus comprising a storage device which stores architecture information regarding a logic element architecture on an array, layout data of an overall programmable logic device including information of a global interconnection, and a netlist of the overall programmable logic device, executes:
a procedure for referencing said storage device, to extract wiring route information regarding wiring route section, based on said architecture information, and then store said wiring route information into said storage device;

a procedure for analyzing said layout data of said overall programmable logic device, to extract parameters of a parasitic element and a crosstalk caused between adjacent interconnections, said parasitic element and said crosstalk caused due to said global interconnection;

a procedure for calculating detailed delay based on said parameters extracted by said analyzing procedure, to store the calculated detailed delay as detailed delay data into said storage device; and a procedure for referencing said storage device, to generate a delay library of said programmable logic device, based on said wiring route information and said detailed delay data.

13. The non-transitory computer-readable recording medium according to claim 12, wherein said delay library includes a delay table having delay information associated with respective coordinate of arrangement of said logic element on said array.

14. The non-transitory computer-readable recording medium according to claim 13, wherein said logic element includes a functional block, said storage device of said delay library generation apparatus further stores, for each route towards said functional block on said logic element, clock route information which indicates clock delay, and said computer program being configured to make a computer perform:

a procedure for referencing said storage device, to generate said delay library, based on said clock route information as well as said wiring route information and said detailed delay data depending on a difference in said clock delay with respect to said functional block on said logic element.

15. The non-transitory computer-readable recording medium according to claim 14, wherein said logic element further includes a programmable switch, and said delay library includes: internal delay information of said functional block; delay information of said programmable switch; and delay information of all route sections specified by said wiring route information.

* * * * *

UNITED STATES PATENT AND TRADEMARK OFFICE
CERTIFICATE OF CORRECTION

PATENT NO. : 8,499,267 B2
APPLICATION NO. : 13/254335
DATED : July 30, 2013
INVENTOR(S) : Toru Awashima and Yoshitaka Izawa It is certified that error appears in the above-identified patent and that said Letters Patent is hereby corrected as shown below:

On the title page item,
    (73) Assignee: NEC Corporation, Tokyo (JP) should appear as follows:
    (73) Assignee: NEC Corporation, Tokyo (JP)
        Assignee: Renesas Electronics Corporation, Kawasaki-shi, Kanagawa (JP)

Signed and Sealed this
Fifth Day of July, 2016

Michelle K. Lee
*Director of the United States Patent and Trademark Office*